(12) United States Patent
Motohashi et al.

(10) Patent No.: US 8,605,448 B2
(45) Date of Patent: Dec. 10, 2013

(54) PRINTED WIRING BOARD

(75) Inventors: Kenji Motohashi, Kanagawa (JP);
Hideji Miyanishi, Kanagawa (JP);
Kazumasa Aoki, Tokyo (JP)

(73) Assignee: Ricoh Company, Limited, Tokyo (JP)

( * ) Notice: Subject to any disclaimer, the term of this patent is extended or adjusted under 35 U.S.C. 154(b) by 160 days.

(21) Appl. No.: 13/064,174

(22) Filed: Mar. 9, 2011

(65) Prior Publication Data
US 2011/0222247 A1 Sep. 15, 2011

(30) Foreign Application Priority Data
Mar. 12, 2010 (JP) .................................. 2010-055764

(51) Int. Cl.
*H05K 1/00* (2006.01)

(52) U.S. Cl.
USPC ............ 361/748; 361/784; 361/792; 361/799

(58) Field of Classification Search
USPC .................................. 361/748, 784, 792, 799
See application file for complete search history.

(56) References Cited

U.S. PATENT DOCUMENTS

| 7,338,290 B2 | 3/2008 | Motohashi et al. |
| 7,355,413 B2 | 4/2008 | Motohashi et al. |
| 7,598,747 B2 | 10/2009 | Motohashi et al. |
| 7,643,980 B2 | 1/2010 | Kazama et al. |
| 2009/0014206 A1 | 1/2009 | Motohashi et al. |
| 2010/0258905 A1* | 10/2010 | Song et al. ................ 257/532 |

FOREIGN PATENT DOCUMENTS

| JP | 09-199818 A | 7/1997 |
| JP | 2006245081 A | 9/2006 |
| JP | 2007158243 A | 6/2007 |
| JP | 201014274 A * | 6/2010 |

\* cited by examiner

*Primary Examiner* — Timothy Thompson
*Assistant Examiner* — Andargie M Aychillhum
(74) *Attorney, Agent, or Firm* — Harness, Dickey & Pierce P.L.C.

(57) ABSTRACT

A printed wiring board includes a bridge located in a surface layer, a noise absorber located on the bridge, a plurality of grounds directly connected or high-frequency-connected to the bridge, a first device using one of the plurality of grounds as a reference potential, a second device using one of the plurality of grounds other than the ground for the first device as a reference potential, and a high-speed signal line that connects the first device and the second device. The high-speed signal line is routed through a layer adjacent to the bridge in a layer direction of the printed wiring board to form a transmission line structure.

9 Claims, 8 Drawing Sheets

PRINTED WIRING BOARD

CROSS-REFERENCE TO RELATED APPLICATIONS

The present application claims priority to and incorporates by reference the entire contents of Japanese Patent Application No. 2010-055764 filed in Japan on Mar. 12, 2010.

BACKGROUND OF THE INVENTION

1. Field of the Invention

The present invention relates to a printed wiring board, in particular, to a printed wiring board that can remove the conduction noise transmitted through a ground.

2. Description of the Related Art

There are many conventional printed wiring boards that include both a digital circuit and an analog circuit on a single printed wiring board. Noise suppression becomes more essential for the devices that are mounted on such printed wiring boards as their operating speed becomes faster. Techniques for noise suppression in these printed wiring boards may include a technique that prevents conduction noise from the ground of a digital circuit from flowing into an analog circuit or a wireless communication circuit by separating the ground of the digital circuit and the ground of the analog circuit or the wireless communication circuit.

For example, Japanese Patent Application Laid-open No. H 09-199818 describes an invention in accordance with such techniques, in which influx of noise generated in a digital circuit can be prevented by constructing a printed inductor as a structure for separating a signal ground and a frame ground or the ground of an analog circuit and the ground of a digital circuit, wherein the printed inductor has a zigzag or spiral wiring pattern to connect these grounds. However, when high-speed signal transmission through a high-speed signal line is used for communication between an analog circuit and a digital circuit, the invention requires a wider pattern width for the printed inductor, when the high-speed signal line pattern is laid out along the shape of the printed inductor so that the return current path necessary for high-speed signal transmission is ensured. Therefore, the inductance value is reduced and the noise generated in the digital circuit may not be effectively suppressed. Additionally, the quality of the signal deteriorates. Moreover, the method disclosed in Japanese Patent Application Laid-open No. H 09-199818 prevents the noise generated in the digital circuit from flowing into the analog circuit by constructing an inductance with a spiral printed inductor as a ground. However, this method also blocks the return signal in the ground directly below the signal line, and thus results in a deteriorated signal. Therefore, the exchange of a digital signal between devices becomes difficult.

Also, Japanese Patent Application Laid-open No. 2006-245081 discloses an invention that provides a digital/analog hybrid printed wiring board with an improved quality of waveform of the signal between the digital circuit and the analog circuit. This is achieved by creating an inner layer wiring pattern between the through holes formed in the digital circuit part and the analog circuit part and creating a spiral return current path including a plurality of through holes formed along the longitudinal direction of the inner layer wiring pattern.

In this invention, it is necessary to increase the pattern width of the spiral conductor to some extent, which constitutes a return current path for the inner layer wiring pattern between the digital circuit and the analog circuit. Therefore, although the shield effect on the wiring pattern can be expected, the inductance value is reduced, and thus, the noise generated in the digital circuit cannot be suppressed effectively.

Consequently, the printed wiring board needs to be redesigned in order to prevent the noise from the digital circuit from flowing into the analog circuit and modification of the design is required.

SUMMARY OF THE INVENTION

It is an object of the present invention to at least partially solve the problems in the conventional technology.

According to an aspect of the present invention, there is provided a printed wiring board including: a bridge located in a surface layer; a noise absorber located on the bridge; a plurality of grounds directly connected or high-frequency-connected to the bridge; a first device using one of the plurality of grounds as a reference potential; a second device using one of the plurality of grounds other than the ground for the first device as a reference potential; and a high-speed signal line that connects the first device and the second device. The high-speed signal line is routed through a layer adjacent to the bridge in a layer direction of the printed wiring board to form a transmission line structure.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 3A is a perspective view showing an exemplary structure, FIG. 3B is an enlarged cross sectional view showing the layers up to a dielectric layer on the section taken along the line A-A in FIG. 3A (a line that passes through a first device 24, a second device 25, a high-speed signal line 26 that connects these devices, and a bridge including vias for the high-speed signal line), FIG. 3C is an enlarged cross sectional view showing the layers up to the dielectric layer taken along the line B-B in FIG. 3A (a line above the high-speed signal line 26 present on a first area), FIG. 3D is an enlarged cross sectional view showing the layers up to the dielectric layer taken along the line C-C in FIG. 3A, and FIG. 3E is an enlarged view of section e of FIG. 3A;

FIG. 7A is a perspective view showing an exemplary structure of a printed wiring board in which a high-speed signal line is routed through a layer other than the surface layer even in an area outside a bridge 27, FIG. 7B is a cross sectional view showing the sectional structure of the printed wiring board taken along the line A-A in FIG. 7A (a line that passes through a first device 24, a second device 25, a high-speed signal line 26 that connects these devices, vias 29 for the high-speed signal line, and the bridge 27), and FIG. 7C is a cross sectional view showing the sectional structure of the printed wiring board taken along the line B-B in FIG. 7A (a line that passes through the first device 24, the second device 25, and the vias on the ground)

DETAILED DESCRIPTION OF THE PREFERRED EMBODIMENTS

Figure 1A:
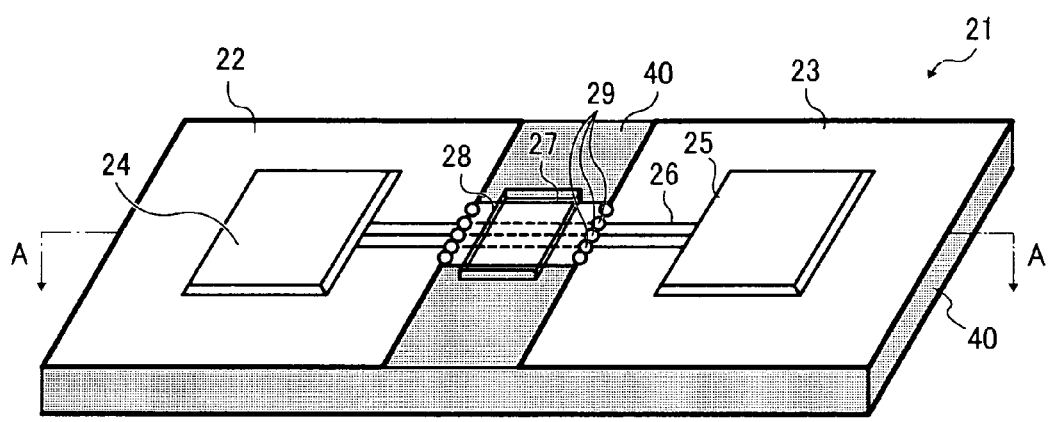
FIG. 1A is a perspective view showing the schematic structure of a printed wiring board of the present invention.

Hereinbelow, the printed wiring board of the present invention will be described in detail by way of embodiments with reference to the accompanying drawings. The printed wiring board of the present invention is a printed wiring board having a microstrip line structure. Since the output signal from a device 24 has a high frequency, it is transmitted through a transmission line structure having a microstrip line structure, which is composed of a high-speed signal line, a ground, and a dielectric.

As is shown in FIG. 1, a printed wiring board 21 of the present invention includes high-speed operable devices 24 and 25 such as a high-speed digital LSI (including a QFP type LSI) and a device operable in an analog fashion, which are linked to each other by a high-speed signal line 26. The high-speed signal line 26 is routed through a layer adjacent to the printed wiring board in the layer direction of the printed wiring board (in the thickness direction of the board) to form the transmission line structure. A noise absorber 28 is located on a bridge 27. When the bridge 27, a first ground 22, and a second ground 23 are located in the surface layer, and the devices 24 and 25, which use the grounds 22 and 23 as reference potentials, respectively, are located on a side on which the bridge is installed, the grounds for the devices are connected by land to the bridge except in the case where the grounds are forced to bypass due to wiring. Therefore, in this case, no via is required for the grounds. In contrast, when the grounds are located in an inner layer or the opposite face to the bridge side (the rear face opposite to the "front face" on which the bridge is located), a ground layer and a voltage layer are always required for a high-frequency connection of a bypass capacitor and vias.

First Embodiment

The above-mentioned printed wiring board 21 of the present invention will be described in accordance with a first embodiment.

Figure 2A:
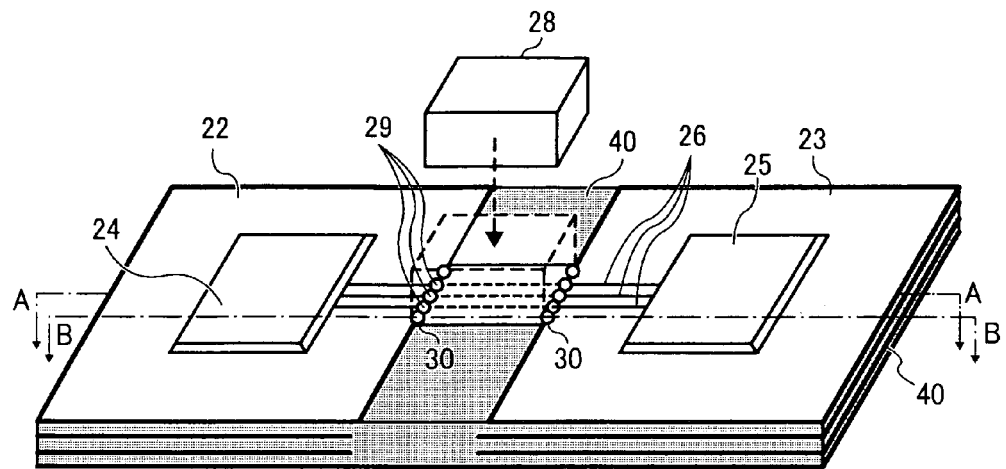
FIG. 2A is a perspective view showing the structure of a multilayer printed wiring board (four layers in the illustrated example) in accordance with a first embodiment.
Figure 2B:
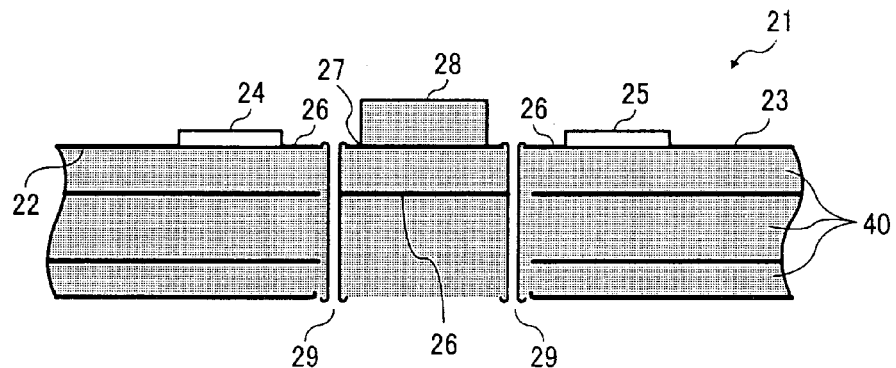
FIG. 2B is a cross sectional view showing the layer structure of the printed wiring board taken along the line A-A in FIG. 2A (a line that passes through a first device 24, a second device 25, a high-speed signal line 26 that connects these devices, and a bridge including vias for the high-speed signal line)
Figure 2C:
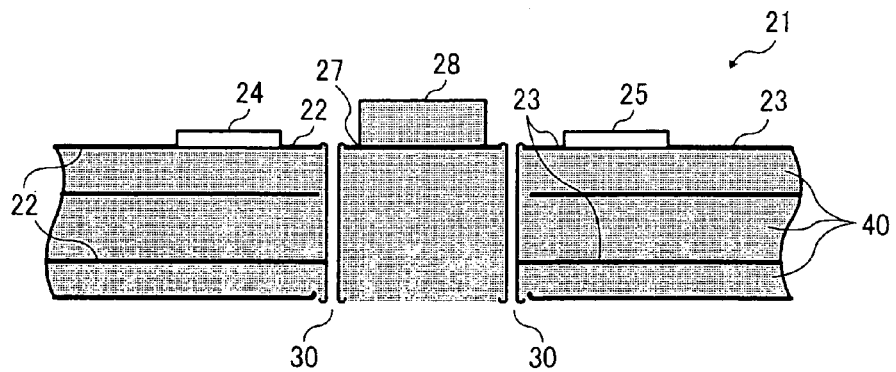
FIG. 2C is a cross sectional view showing the layer structure of the printed wiring board taken along the line B-B in FIG. 2A (a line that passes through the first device 24, the second device 25, and the vias on a ground)

FIGS. 2A to 2C illustrate the first embodiment of the printed wiring board 21 of the present invention. More specifically, FIG. 2A illustrates the structure of the printed wiring board 21 in accordance with the first embodiment. FIG. 2B is a cross sectional view showing the layer structure of the printed wiring board taken along the line A-A in FIG. 2A (a line that passes through a first device 24, a second device 25, the high-speed signal line 26 that connects these devices, vias 29 for the high-speed signal line, and the bridge 27). FIG. 2C is a cross sectional view showing the layer structure of the printed wiring board 21 taken along the line B-B in FIG. 2A (a line that passes through the first device 24, the second device 25, vias 30 on a ground, and the bridge 27). Note that FIGS. 2A to 2C are provided merely to describe the positional relationship of the components in the printed wiring board 21. For this reason, thickness of layers, sizes of elements and the like, and the size and width of the bridge 27, and the like as shown in these drawings are different from an actual structure.

As is shown in FIGS. 2A to 2C, the grounds 22 and 23 located in the surface layer are connected via the bridge 27 located in the surface layer. The high-speed signal lines 26 between the device 24 using one ground 22 as a reference potential and the device 25 using the other ground 23 as a reference potential is routed through a layer (for example, copper foil) adjacent to the bridge 27 in the layer direction of the printed wiring board 21 (in the thickness direction of the board) to form a transmission line structure together with the bridge 27. Furthermore, the noise absorber 28 is located detachably on the bridge 27. As is shown in FIGS. 2A to 2C, the first embodiment is implemented by an example that provides a solution to suppress conduction noise that is transmitted from one ground 22 into the other ground 23 and ensure a return current path for the signal current through the high-speed signal lines 26. As used herein, the term "bridge" refers to a bridge-like structure for transmitting a signal.

The first embodiment is, as shown in FIGS. 2A to 2C, an example wherein the first ground (a first area) 22 and the second ground (a second area) 23 are located in the surface layer of the printed wiring board 21. In the printed wiring board 21 in the present embodiment, the plane on which the bridge is located and the plane on which the first ground (the first area) 22 and the second ground (the second area) 23 are located exist on the same face (surface: front face). In the example shown in FIG. 2, the first ground 22 and the second ground 23 are directly connected or high-frequency-connected to the bridge 27. Power is supplied from the voltage layer to the devices 24 and 25 by vias, which are not shown in the drawing.

As shown in FIG. 2, the device 24 (for example, a digital device) and the device 25 (for example, an analogue device) can be mounted on the printed wiring board 21. The device 24 uses the first area 22, which is one ground, as a reference potential, and the device 25 uses the second area 23, which is the other ground (the second ground), as a reference potential. The devices 24 and 25 are connected by the high-speed signal lines 26. The ground 22 as a reference potential of the device 24 and the ground 23 as a reference potential of the device 25 are located in the surface layer of the printed wiring board 21. Furthermore, the grounds 22 and 23 are directly connected or high-frequency-connected to the bridge 27 located in the surface layer, and the noise absorber 28 is configured to be in close contact with the bridge 27 with no gap. Such structure enables an efficient removal of the conduction noise from the ground with a frequency that operates in the area on the side of the device 24 by focusing the noise to the bridge 27 and converting the noise to heat by the noise absorber 28 on the bridge 27, wherein, for example, the bridge 27 may play a role as a heat sink. In the printed wiring board of the present invention, the noise absorber 28 is exchangeable, as various noise absorbers can be attached to the bridge 27. Then, the conduction noise from the ground that is to be removed can be suppressed according to needs by exchanging the noise absorbers several times and examining their noise absorbance effects. The voltage layers for the devices 24 and 25 are located on the opposite face (rear face) when the printed wiring board of the present invention is a two-layer board, whereas they are located on the opposite face or in the inner layer when the printed wiring board is a multi-layer board.

The material used for this noise absorber 28 may be one material or a combination of a plurality of materials. Moreover, not only the type of the material of the noise absorber 28 but also its thickness can be changed. The printed wiring board of the present invention allows one to exchange various noise absorbers as the noise absorber 28 for the noise to be removed, examine their effects, and select them appropriately. In that case, each noise absorber is attached to the bridge 27 so as to be in close contact therewith no gap on every exchange, so that the noise absorber can produce the maximum noise absorption effect. The bridge 27 used in the printed wiring board of the present invention has adjustable width, area, and the like as desired.

In the present invention, the noise absorber 28 attached on the bridge 27 is preferably a magnetic absorber. In the printed wiring board of the present invention, the material property, type, thickness, and the like of this magnetic absorber can be changed as described above. In the printed wiring board of the present invention, an adhesive (for example, a pressure-sensitive adhesive: an adhesive agent) may be used as attaching means for attaching the noise absorber to the bridge 27. Such an adhesive can be used for temporal adhesion when a plurality of candidates needs to be exchanged and attached to assess the noise absorption effect of the noise absorber 28. Then, when one absorber is selected as the noise absorber 28, the adhesive can be used as fixation means for fixing the absorber permanently. As described above, the printed wiring board of the present invention has a very high degree of flexibility for selection of a noise absorber. Moreover, since the high-speed signal lines 26 used in the printed wiring board of the present invention can follow a wide operating frequency range of the device 24, the printed wiring board can respond to a wide range of users' needs.

In the printed wiring board of the present invention, the device 24 that uses the ground 22, one of the plurality of grounds, as a reference potential and the device 25 that uses the ground 23, the other ground that is other than the ground 22, as a reference potential are connected by the high-speed signal lines 26. As shown in FIGS. 2A and 2B belonging to the first embodiment, the high-speed signal lines 26 extending from the device 24 exist on the same face as one of the grounds such as the ground 22 (or ground 23). These parts of the high-speed signal lines 26 are connected, by the vias 29 in the vicinity of one end of the bridge 27, to the high-speed signal lines 26 that are located in a wiring layer (for example, copper foil) adjacent to the bridge 27 in the layer direction of the printed wiring board to form the transmission line structure. As shown in FIG. 2B, the parts of the high-speed signal lines 26 located in the adjacent wiring layer are connected to the high-speed signal lines 26 on the same surface as the other ground 23 by the vias 29 at the other end of the bridge 27. Then, these parts of the high-speed signal lines 26 are linked to the device 25 using the second area 23 as a reference potential.

As described above, since the high-speed signal lines 26 can be routed through a layer adjacent to the bridge 27 in the layer direction of the printed wiring board to form the same transmission line structure, characteristic impedance of the whole line can be kept constant. Therefore, signal reflection due to an impedance mismatch can be prevented and the return current path can be ensured even in the vicinity of the bridge 27. Moreover, the noise absorber 28 with a relative dielectric constant ∈1 and a relative permeability μ1 does not affect the properties of the wiring pattern or cause an impedance mismatch, and therefore good signal quality can be ensured.

The printed wiring board of the present invention can be considered, assuming that it is an ideal circuit, that a ground layer and a voltage layer provided on a separate layer are connected by a capacitor surrounded by a dielectric 40 (bypass capacitor). Alternatively, instead of the above-mentioned capacitor, a really-existing capacitor (real capacitor) can be used to connect a ground in the surface layer and a voltage layer provided in a separate layer. Additionally, in the present invention, a ground layer and one or more voltage layers, which are provided in a layers other than the ground layer, are linked by the above-mentioned capacitor and vias so that a ground, which a device uses as a drive or a receiver of signals, is high-frequency-connected to the bridge. As a result, the transmission line structure for the high-speed signal lines 26 is formed. In this case, a power supply pattern used as a return path of the transmission line serves as a bridge. In the case of wiring with a plurality of voltage layers, the bridge as a return path is high-frequency-connected in series to each of the above-mentioned one or more voltage layers and the above-mentioned ground by the above-mentioned capacitor and vias.

The first embodiment will be described in more detail with reference to examples below. However, the printed wiring board of the present invention should not to be construed as limited to these examples.

Example 1

Figure 3A:
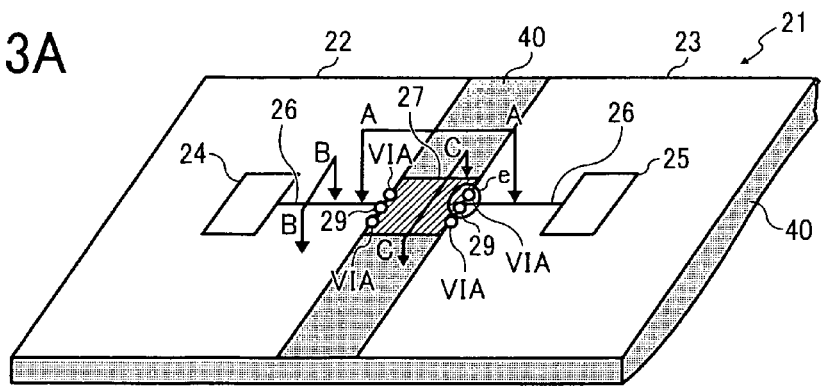
FIGS. 3A to 3E illustrate a more detailed example of the first embodiment based on Example 1.

FIGS. 3A to 3E are diagrams for describing this example. As shown in FIG. 3A, the printed wiring board in accordance with Example 1 has one device on each ground area: the device 24 within the first ground area 22 and the device 25 within the second ground area 23. Then, the devices 24 and 25 on respective areas are connected to each other by a high-speed signal line 26. This example demonstrates an exemplary printed wiring board in accordance with the first embodiment that has the first ground area 22 and the second ground area 23 on the same surface of the printed wiring board. The first embodiment is a printed wiring board in which the first ground area 22 and the second ground area 23 each are connected to different one of the plurality of grounds. Moreover, the plurality of grounds are directly connected or high-frequency-connected to a bridge 27 located in a surface layer. In this case, electric potentials of the bridge 27 and the plurality of grounds may be different.

Figure 3B:
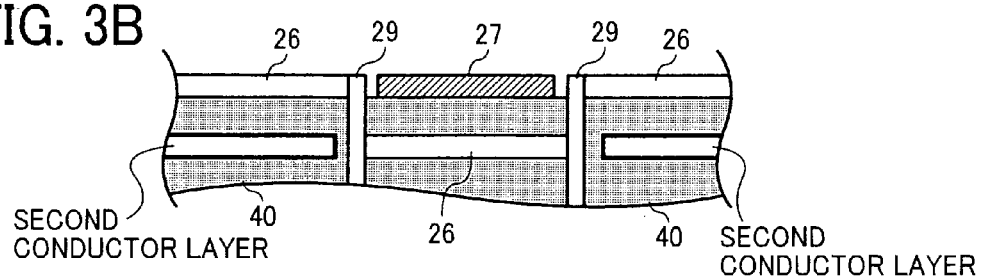
Figure 3C:
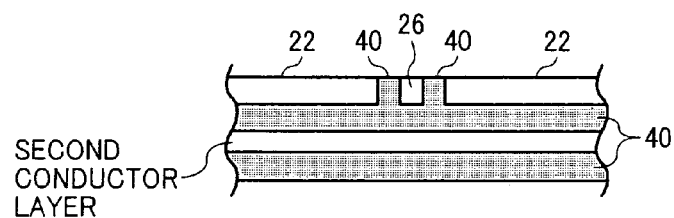
Figure 3D:
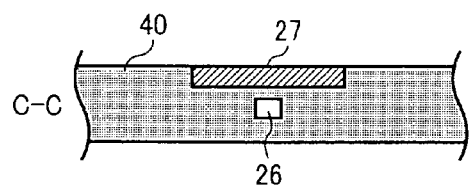

FIGS. 3B, 3C, and 3D illustrate the sectional structure of the printed wiring board 21 in accordance with this example taken along the lines A-A, B-B, and C-C in FIG. 3A, respectively. As with FIGS. 2A to 2C, these drawings merely show the layout structure, and the thickness, the length, the number of wiring layers, and the like are inconsistent with an actual layout structure.

The high-speed signal line 26 extending from the high-speed device 24 in the first area 22 is laid on the same surface as the first ground area 22 and the second ground area 23 and within each of these areas, and is insulated from the grounds.

Figure 3E:
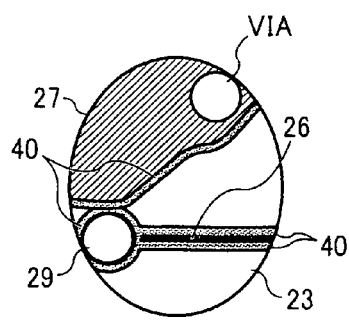

This high-speed signal line 26 has a structure insulated by being surrounded and covered by the dielectric 40 within each area, as shown in FIG. 3C. Additionally, the parts of high-speed signal line 26 on the first ground area 22 and the second ground area 23 are linked by the bridge 27 as a conductor, as shown in FIG. 3B. As shown in FIG. 3B, the high-speed signal line 26 within the first ground area 22 is electrically connected to the vias 29 in the vicinity of one end of the bridge 27. The high-speed signal line 26 is routed through a layer adjacent to the bridge 27 in the layer direction of the printed wiring board to form a transmission line structure. FIG. 3D is an enlarged cross sectional view of the layers up to a dielectric layer taken along the line C-C in FIG. 3A. FIG. 3E is an enlarged view of the section e in FIG. 3A. As shown in this drawing, the vias 29 are surrounded by the dielectric 40 with the exception of the part which makes electrical contact with the high-speed signal line 26. When the bridge 27 is not connected to the ground area at the part wherein the vias 29 are close to the bridge 27 as shown in section e and FIG. 3E, vias may be created to connect the bridge 27 to a potential region of inner layers (an area with a different potential, for example, voltage layer).

As shown in this example, the device 24 within the first ground area 22 may be, for example, a digital device 24, and the device 25 located within the second ground area 23 may be an analog device, for example. This also applies to other examples.

Example 2

Next, Example 2 belonging to the first embodiment will be described with reference to FIGS. 4A and 4B.

Figure 4A:
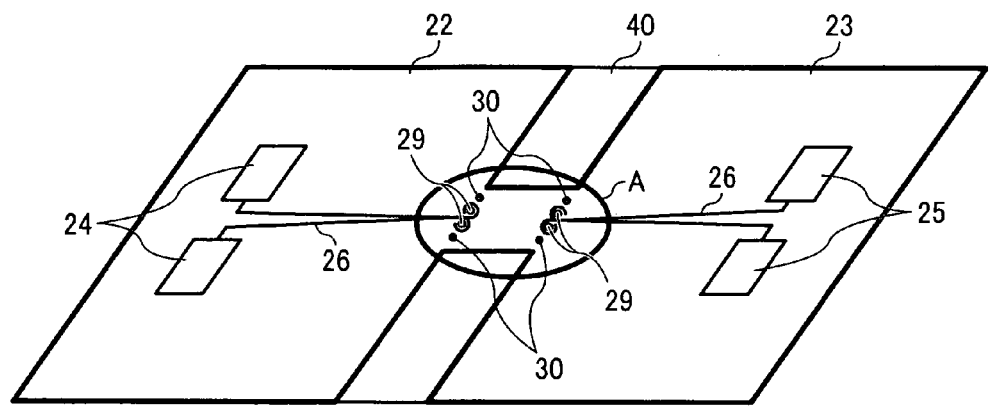
FIG. 4A is a schematic perspective view showing only a surface layer of a more detailed example of the first embodiment based on Example 2.
Figure 4B:
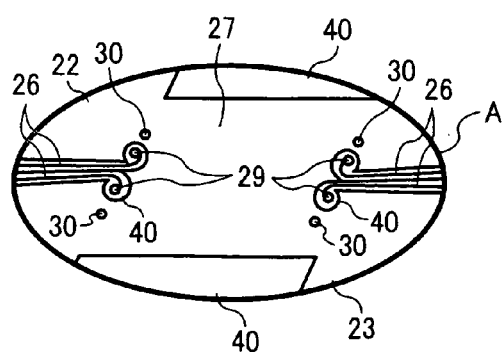
FIG. 4B is an enlarged view of the section A of FIG. 4A (an enlarged view showing an exemplary high-speed signal line)

FIG. 4A illustrates Example 2 of the first embodiment. FIG. 4B is an enlarged view of section A in FIG. 4A. This example demonstrates an exemplary printed wiring board that has a plurality of devices within one area and in which high-speed signal lines 26 extending from each of the devices, for example two devices, are laid out close to each other. The number of high-speed signal lines 26 extending from the plurality of devices 24, each of which exists within an identical first ground area 22, are equal to the number of the devices 24 within that area. Each of the devices 24 within the first ground area 22 is connected to corresponding one of devices 25 within a second ground area 23 by corresponding one of the high-speed signal lines 26. The plurality of grounds are high-frequency-connected to a bridge 27 located in a surface layer. In the first embodiment, the first ground area 22 and the second ground area 23 are independently connected to a different ground among the plurality of grounds. Moreover, the bridge 27 and the plurality of grounds may have different electric potentials.

As shown in FIG. 4A, the high-speed signal line 26 extending from the high-speed device 24 within the first ground area 22 is laid on the same surface as the first ground area 22 (the first ground) and the second ground area 23 (the second ground). The high-speed signal line 26 is surrounded and covered by a dielectric 40, as is shown in FIG. 4B. Furthermore, although not shown in FIGS. 4A and 4B, two close high-speed signal lines 26 are laid on the same surface of the printed wiring board as the first ground area 22 and the second ground area 23, as with FIG. 3C. However, in the layout shown in FIG. 3C, one high-speed signal line 26 is surrounded by the first ground area 22 and the dielectric 40 and exists on the surface of the printed wiring board. In Example 2, one high-speed signal line 26 and another high-speed signal line 26 are laid out close to each other with the dielectric 40 therebetween. These high-speed signal lines 26 are surrounded by the first ground area 22 with the dielectric 40 therebetween. Each of the high-speed signal lines 26 in the second ground area 23 is laid out similarly.

Thus, this example is the case in which the high-speed signal lines 26 extending from one device 24 within the first ground area 22 and those extending from the other device 24 within the same area are laid out close to each other with the dielectric 40 therebetween. Then, each of the high-speed signal lines 26 within the first ground area 22 is electrically connected to corresponding one of the vias 29 at one end of the bridge 27. In more detail, as shown in FIG. 4B, each of the high-speed signal lines 26 laid out close to each other within the first ground area 22 is connected to the corresponding one of the vias 29 that exist near one end of the bridge 27. Then, each of the high-speed signal lines 26 forms a transmission line structure on a layer adjacent to this bridge 27 in the layer direction of the printed wiring board and is electrically connected to corresponding one of the high-speed signal lines 26, which is located electrically independently (i.e., with no conduction) from the bridge 27, by corresponding one of vias 29. Then, each of the linked high-speed signal lines 26 is linked to corresponding one of the vias 29 in the vicinity of the other end of the bridge 27. The high-speed signal lines 26 are laid out close to each other with the dielectric 40 therebetween in the second area 23, in the same way as the corresponding one of the high-speed signal lines 26 within the first area 22. As shown in FIG. 4B, these close high-speed signal lines are surrounded by the dielectric 40 in the second area. Then, each of the high-speed signal lines 26 within the second area 23 is linked to corresponding one of the devices 25. As shown in FIG. 4B, in this example, the vias 29 at one end of the bridge 27 are also surrounded by the dielectric 40 except for the parts that are linked to the respective high-speed signal lines 26, which are output lines from the respective devices 24 in the first area. One sides of these adjacent vias 29 are surrounded by the bridge 27, that is a conductor, with the dielectric 40 therebetween, and the other sides of them are surrounded by the first area 22 or the second area 23. These adjacent vias 29 are laid out separately from each other in FIG. 4B. In this example, although the vias 29 are located separately from each other, this invention is not limited to this lay out. Additionally, additional vias to connect other layers may be provided between the adjacent vias 29.

Example 3

Next, Example 3 will be described with reference to FIGS. 5A and 5B. This example also belongs to the first embodiment and is the case in which the first ground (a first area) 22 and a second ground area 23 exist in the surface layer located on the same side of the board as a bridge 27. Moreover, similarly as described above, a plurality of grounds are directly connected or high-frequency-connected connected to the bridge 27 located in the surface layer.

Example 3 describes an example of combination of elements from both Example 1 and Example 2 described above. That is, as shown in FIGS. 5A and 5B, a plurality of devices are provided in one area, and the high-speed signal lines 26 extending from two adjacent devices among them are adjacent to each other. Another high-speed signal line 26 extending from another adjacent device, which exists within the same area as the two adjacent devices, is laid out separately from the adjacent high-speed signal lines 26.

Figure 5A:
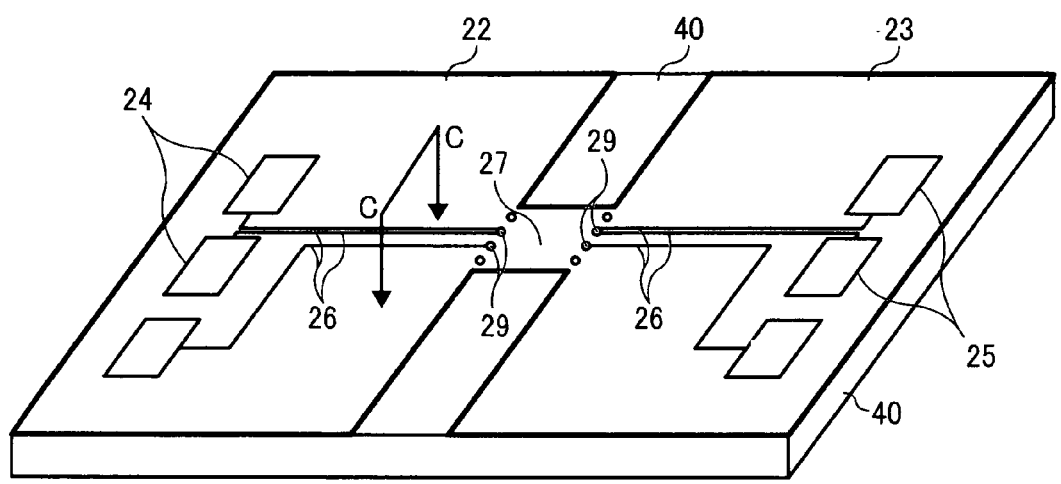
FIG. 5A is a perspective view showing a more detailed example of the first embodiment based on Example 3, which includes a structure with many devices by combining Example 1 and Example 2.
Figure 5B:
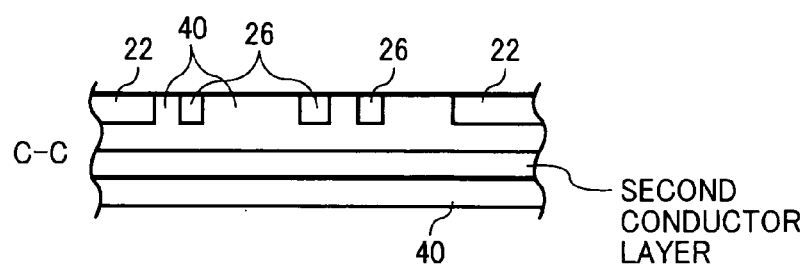
FIG. 5B is an enlarged cross sectional view showing the layers up to a dielectric layer taken along the line C-C in FIG. 5A.

Additional explanation about the example shown in FIGS. 5A and 5B is omitted since it is similar to those for Example 1 and Example 2 described above.

Also in the present example, vias 29 that are either on one end or the other end of the bridge 27 may be laid out in a mixed manner (but electrically independently) with vias that are connected to a potential in the inner layer.

Figure 6A:
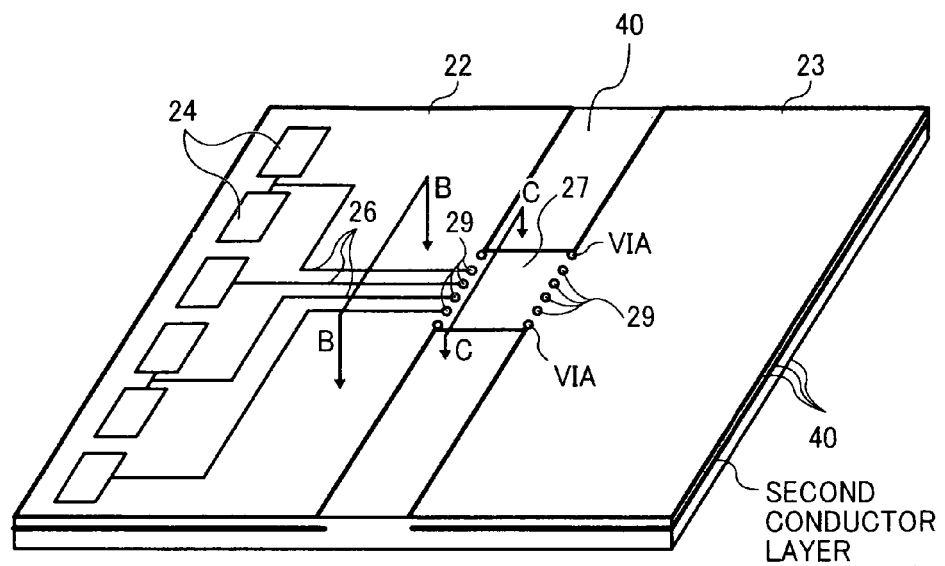
FIG. 6A is a perspective view showing another example of Example 3.
Figure 6B:
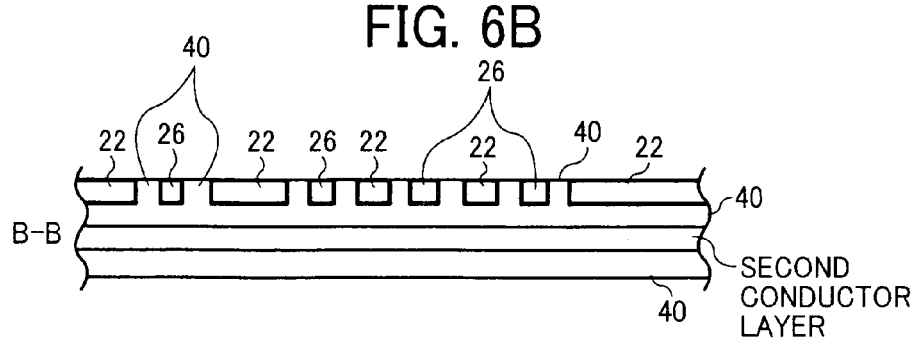
FIG. 6B is an enlarged cross sectional view showing the layers up to a dielectric layer taken along the line B-B in FIG. 6A.
Figure 6C:
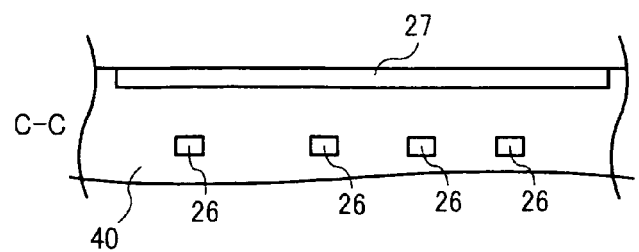
FIG. 6C is an enlarged cross sectional view of the layers up to the dielectric layer taken along the line C-C in FIG. 6A.

Furthermore, another example of the present example is shown in FIGS. 6A to 6C. FIGS. 6B and 6C are cross sectional views taken along the lines B-B and C-C in FIG. 6A, respectively and are provided merely to describe the structure of the layout up to a dielectric layer. Therefore, similarly as described above, thickness, length, the number of wiring layers, and the like in these drawings are inconsistent with the same obtained by simply enlarging or sectioning FIG. 6A.

In the another example shown in FIG. 6B, the high-speed signal lines 26 extending from the adjacent devices 24 within the same area are installed close to each other. Moreover, another high-speed signal line 26 from another device 24 within the same area, which is adjacent to these devices, is laid out separately from the set of the adjacent high-speed signal lines 26. In other words, in the another example shown in FIGS. 6A to 6C, the set of adjacent high-speed signal lines 26 and another high-speed signal line 26 separate from the set are alternately laid out.

Also in Example 3, as shown in FIG. 6A, the device 24 using one ground, the first ground area 22, as a reference potential and the device 25 (not shown) using the other ground, the second ground area 23, as a reference potential are connected by the high-speed signal lines 26. The high-speed signal lines 26 extending from the respective devices 24 are connected, by vias 29 in the vicinity of one end of the bridge 27, to the corresponding high-speed signal lines 26 that are located in the wiring layer that is adjacent to the bridge 27 in the layer direction of the printed wiring board to form a transmission line structure. The high-speed signal lines 26, which are routed through the wiring layer that is adjacent to the bridge 27 in the layer direction of the printed wiring board to form the transmission line structure, are connected, by vias 29 in the vicinity of the other end of the bridge 27, to the high-speed signal lines 26 within the second ground area 23. Then, the high-speed signal lines 26 within the second ground area are connected to the device(s) 25 within the second ground area that corresponds to the respective devices 24 within the first ground area. Also, as shown in FIG. 6B, within the first ground area, the high-speed signal lines 26 and the first ground area 22 are provided with the dielectric 40 therebetween. Additionally, somewhat separate from the high-speed signal line 26, another high-speed signal line 26 close to the first high-speed signal line 26 is laid out, and still another high-speed signal line 26 is laid out separate therefrom. Thus, FIGS. 6A to 6C show an example in which the high-speed signal lines 26 are provided close to each other and an example in which the set of adjacent high-speed signal lines 26 and another high-speed signal line 26 separate from the set are alternately laid out. In other words, a set of adjacent high-speed signal lines close to each other is located separately from another high-speed signal line located separate. FIG. 6C illustrates an example in which the high-speed signal lines 26 are located in the wiring layer adjacent to the bridge 27 in the layer direction of the printed wiring board. The respective high-speed signal lines 26, which are located in the wiring layer that is adjacent to the bridge 27 in the layer direction of the printed wiring board to form the transmission line structure, are located at almost same intervals as those of the vias 29, which are located in the vicinity of the bridge 27, as is illustrated in FIG. 6C.

In FIG. 6A, the layout of the components within the other ground area 23, which corresponds to the high-speed signal lines 26 within the ground area 22 and the devices 24 on the ground area 22, is omitted. The omitted layout within the ground area 23 is similar to the layout of the corresponding high-speed signal lines 26 and the devices 24 within the ground area 22.

Example 3 shown in FIG. 6 provides a layout in which the sets of the adjacent high-speed signal lines 26 and the single high-speed signal line 26 are alternately located. However, a layout in which a plurality of high-speed signal lines are provided close to each other and a layout in which lines are installed separately from each other at equal intervals are also encompassed by the present invention.

Example 4

Figure 7A:
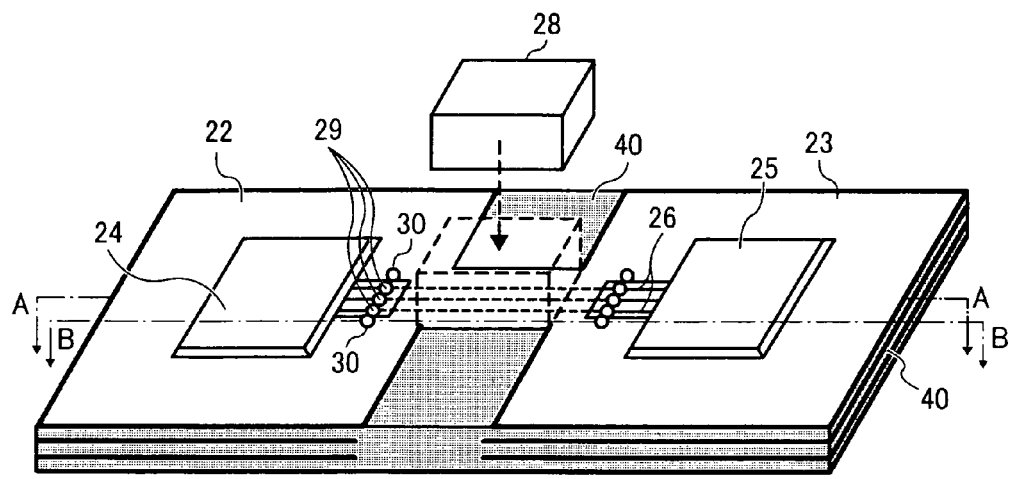
FIG. 7A to 7C illustrate Example 4 of the first embodiment and shows only a surface layer.
Figure 7B:
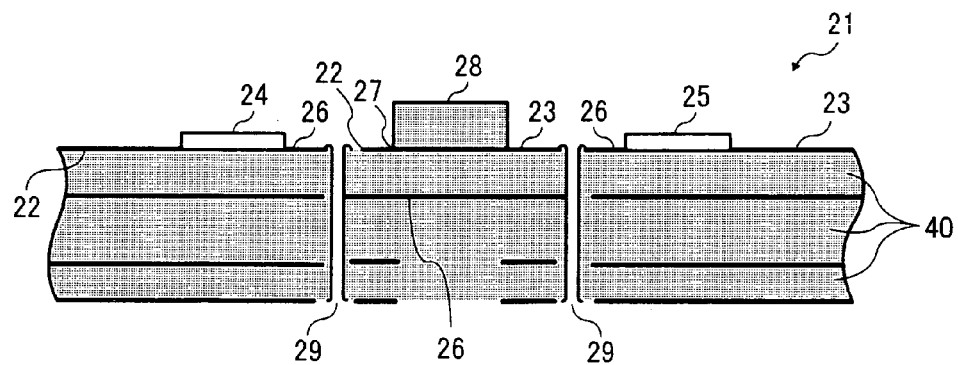
Figure 7C:
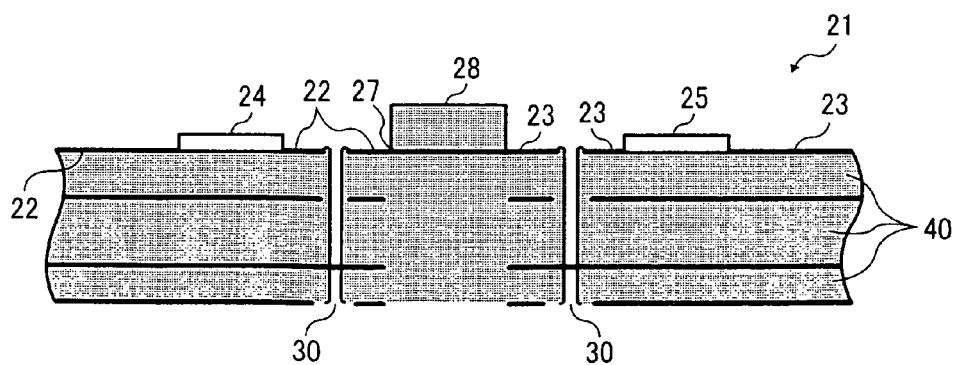

Next, Example 4 will be described with reference to FIGS. 7A to 7C. FIG. 7A shows an exemplary structure in which high-speed signal lines 26 are installed in a location other than a bridge 27. Specifically, the high-speed signal lines 26 are routed through a layer other than the surface layer in the vicinity of the bridge 27. FIG. 7B shows the sectional structure taken along the line A-A in FIG. 7A. FIG. 7C shows the sectional structure taken along the line B-B in FIG. 7A.

In Example 4, the high-speed signal lines 26, which connect a device 24 within a first area 22 and a device 25 within a second ground area 23, are routed through a layer adjacent to the bridge 27 in the layer direction of the printed wiring board to form a transmission line structure. In Example 4, the high-speed signal line 26 is routed through a location other than the surface layer. The illustrated example is the case in which the high-speed signal lines 26 are installed on a second layer. However, the high-speed signal line 26 has a unique characteristic impedance depending on its specification, and the characteristic impedance of the line is adjusted depending on its specification. Accordingly, the layer on which the high-speed signal lines 26 are installed is not limited to the second layer. Example 4 also belongs to the first embodiment.

In the above description in the first embodiment, several examples in which the devices 24 and 25 and the grounds as their reference potentials exist on the same surface were described. However, in the first embodiment, at least one of the devices 24 and 25 may be mounted not on the same face but on the opposite face. For example, when the printed wiring board is a two-layer wiring board, in the first embodiment and when at least one of the devices is mounted on the opposite face, the ground for the device is connected by vias.

Second Embodiment

Next, the printed wiring board of the present invention will be described in accordance with a second embodiment.

Figure 1B:
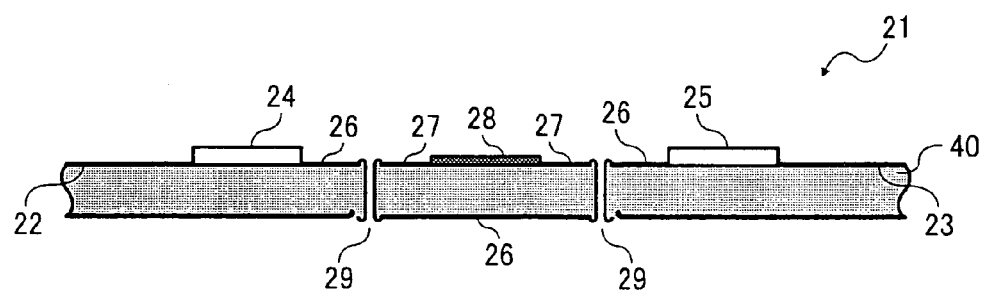
FIG. 1B is a cross sectional view of the printed wiring board taken along the line A-A in FIG. 1A (a line that passes through a first device 24, a second device 25, a high-speed signal line 26 that connects these devices, and a bridge including vias for the high-speed signal line)

The example shown in the second embodiment is the second means for solving one of the problems of the present invention. The object is to suppress conduction noise that is transmitted from one ground into the other ground and ensure the return current path for a high-speed signal line pattern. A ground located in an inner layer or an opposite face (rear face) is connected to a bridge 27 located in the surface layer by vias. Then, as shown in FIGS. 1A and 1B, a high-speed signal lines 26 electronically connecting a device 24 using one ground as a reference potential and a device 25 using the other ground as a reference potential are routed through a layer adjacent to the bridge 27 in the layer direction of the printed wiring board to form a transmission line structure. In the present embodiment, a noise absorber 28 may be attached onto the bridge 27, as in the first embodiment. Such a printed wiring board according to the second embodiment will be described with reference to FIGS. 8A to 8C. Identical reference numerals indicate identical components in FIGS. 8A to 8C and other drawings.

Figure 8A:
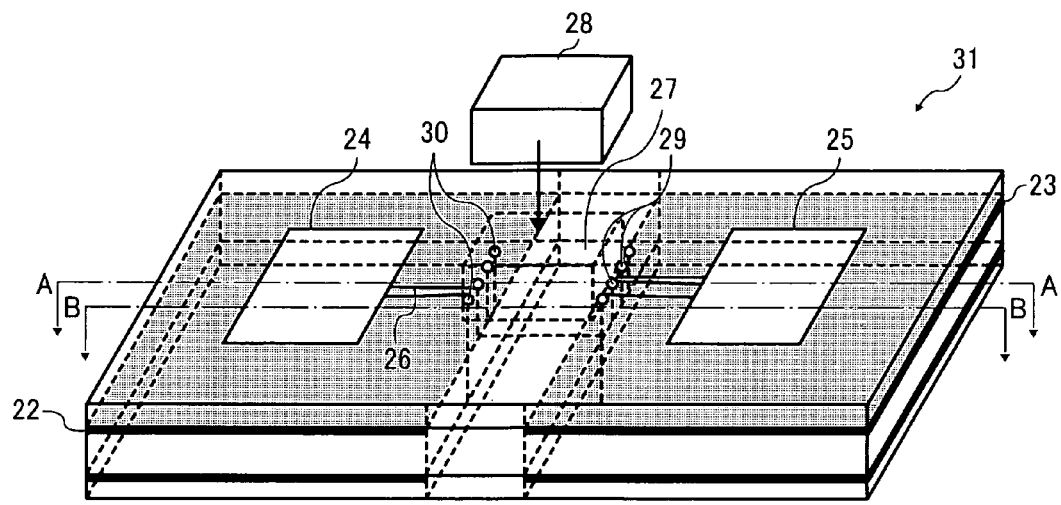
FIG. 8A is a perspective view showing the structure of a printed wiring board (a multilayer wiring board that has three or more layers) of a second embodiment where a ground is present on an inner layer or on the opposite face.
Figure 8B:
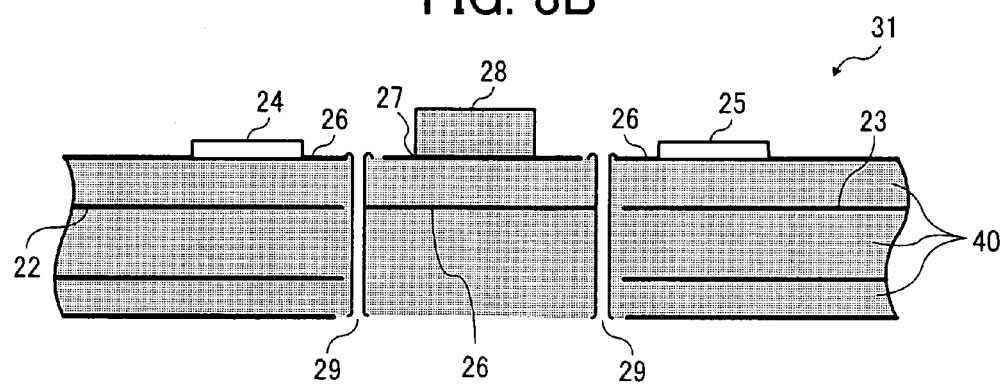
FIG. 8B is a cross sectional view showing the sectional structure of the printed wiring board taken along the line A-A in FIG. 8A (a line that passes through a first device 24, a second device 25, a high-speed signal line 26 that connects these devices, vias 29 for the high-speed signal line 26, and a bridge 27)
Figure 8C:
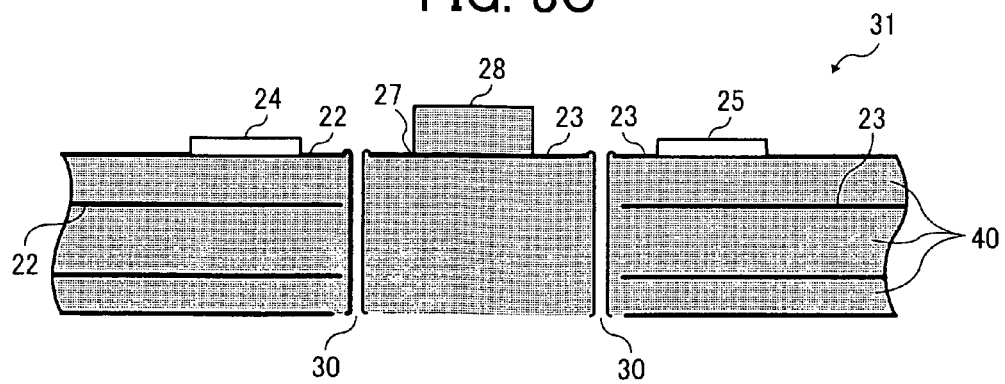
FIG. 8C is a cross sectional view showing the sectional structure of the printed wiring board taken along the line B-B in FIG. 8A (a line that passes through the first device 24, the second device 25, the vias 30 on the ground, and the bridge 27).

FIGS. 8A to 8C show an exemplary layout of a printed wiring board that has a plurality of grounds in its inner layer and the grounds as well as an exemplary countermeasure thereof.

FIG. 8B is a sectional view taken along the line A-A in FIG. 8A, that is, a line that passes through a device 24 and a high-speed signal line 26, vias 29 connecting the line to an inner layer, a high-speed signal line 26 in the inner layer, vias 29 connected to the inner layer, a high-speed signal line 26, and a device 25. Note that FIG. 8B is provided for describing the structure of a cross-sectioned layer of the printed wiring board, and the size, thickness, and the like are different from an actual printed wiring board.

In the second embodiment, the devices 24 and 25 are mounted on a multilayer printed wiring board 31. The device 24 uses one ground (a first ground area 22) as a reference potential, and the device 25 uses the other ground (a second ground area 23) as a reference potential. These devices 24 and 25 are connected by the high-speed signal line patterns 26. Moreover, the first ground area 22, which is a ground serving as the reference potential of the device 24, and the second ground area 23, which is a ground serving as the reference potential of the device 25, are located in the inner layer or on the opposite face and are electrically connected to the bridge 27 located in the surface layer by the vias 30. The noise absorber 28 may be attached onto the bridge 27.

In the second embodiment, the surface layer is not a ground. For example, as shown in FIG. 8B, the device 24 and the device 25 are mounted on the multilayer printed wiring board 31. In the printed wiring board of the present embodiment, the ground (the first ground area) 22 for the device 24, which uses one ground as its reference potential, and the ground (the second ground area) 23 for the device 25, which uses the other ground as its reference potential, are located in, for example, the second layer of the multilayer printed wiring board 31. The bridge 27 is directly connected or high-frequency-connected to a plurality of grounds. Then, the high-speed signal lines 26 are located in a wiring layer adjacent to the bridge 27 in the layer direction of the printed wiring board to form the transmission line structure.

Such structure may prevent the conduction noise from the ground with a frequency that operates in the area on the side of the device 24 from flowing from the ground in an inner layer or on the opposite face (the first area 22) into the other ground (the second area 23), and may focus the conduction noise to the bridge 27 and the noise absorber 28.

The noise concentration as described above by locating the noise absorber 28 on the bridge 27 in the surface layer allows an efficient suppression of the conduction noise arising from the ground in the inner layer.

As shown in FIGS. 8A to 8C, the device 24 and the device 25 are connected by the high-speed signal lines 26 routed through the surface layer. The high-speed signal lines 26 are located in a wiring layer adjacent to the bridge 27 in the layer direction of the printed wiring board, so that the high-speed signal lines 26 including vias 29 for the high-speed signal lines 26 provided in the vicinity of the bridge 27 forms the transmission line structure together with the bridge 27. Accordingly, the characteristic impedance of the transmission line structure matches the line on the board. Moreover, as shown in FIG. 8B, the first ground area 22, which is the first ground, and the second ground area 23, which is the second ground, are located in the inner layer (or on the opposite face), and it is possible to mount the devices 24 and 25, which are connected to the respective grounds, on the surface layer. An electrical connection of the devices 24 and 25 to the respective grounds is made by the vias. Furthermore, the first ground area 22 and the second area 23, which are grounds provided in the inner layer of the multilayer printed wiring board 31, are connected to the bridge 27 by the vias. The area in the vicinity of the bridge 27 to which the high-speed signal lines 26 and the vias 29 are connected is surrounded by the dielectric 40, in the same way as shown in FIG. 3E or FIG. 4B. The bridge 27 and the first area 22 or the second ground area are connected by the vias 29 or the vias 30.

As shown in FIGS. 7A to 7C, also in the second embodiment, the bridge 27 is located in the surface layer and the noise absorber 28 is configured to be located on the bridge 27 as with the first embodiment. The attaching method of the noise absorber 28 to be used, the material of the noise absorber, and the like are similar to those in the first embodiment. As is the case with the first embodiment, the present embodiment also allows the plurality of grounds and the bridge to have different potentials. Moreover, in the first and second embodiments, when the potentials of the grounds and the bridge are different from each other, they are high-frequency-connected in series by vias and a capacitor.

As with the first embodiment, in the second embodiment, it is possible to prevent signal reflection due to an impedance mismatch and ensure the return current path in the vicinity of the bridge 27. Moreover, a relative dielectric constant and a relative permeability of the noise absorber 28 do not affect the properties of the high-speed signal line pattern or cause an impedance mismatch, and therefore, good signal quality can be ensured.

In the first and second embodiments described above, the printed wiring board of the present invention that can provide reduction of the conduction noise from grounds when the grounds are electrically connected was described by taking the connection between the two devices 24 and 25 on different grounds as an example. However, in the present invention, the number of different grounds is not limited to two. Thus, the printed wiring board of the present invention provides for reduction of the conduction noise from grounds occurring between electronic devices provided on the plurality of grounds. The printed wiring board of the present invention is configured to be able to reduce, for example, noise intensity of the noise at a targeted part derived from the conduction noise from the grounds between circuits, wherein one closed circuit is formed by the device present on each ground.

Thus, in the present invention, the plurality of grounds are located in the surface layer or the inner layer of the printed wiring board, and the plurality of grounds are connected to the bridge 27, which is a bridge-like conductor located in the surface layer of such a printed wiring board. A device using one of the plurality of grounds as a reference potential (the first device 24) and a device using one of the remaining grounds other than the above-mentioned ground as a reference potential (the second device 25) are connected by the high-speed signal lines 26, thereby forming one closed circuit. These high-speed signal lines 26 electrically connect the first device 24 and the second device 25. Moreover, as shown in FIG. 1, the high-speed signal lines 26 are routed through a layer adjacent to the bridge 27 in the layer direction of the printed wiring board to form the transmission line structure, and the noise absorber may be attached to the bridge 27. The width, dimension, and the like of the bridge used in the present invention may be decided as appropriate based on evaluation, as with the first embodiment.

Also in the present embodiment, when the device 24 using the first potential as a reference and the device 25 using the second potential as a reference as described above form a closed electric circuit, reduction of the conduction noise from the grounds between these devices 24 and 25 may be expected.

The noise absorber 28 that can reduce such conduction noise from the grounds may be evaluated if it reduces particularly noise having a frequency around the operating frequency of the device or not. In the present invention, a plurality of candidate noise absorbers can be tested if necessary and all of them can be evaluated. In some cases, one of the candidates can be selected and used on a specific circuit board in the present invention.

Moreover, as with the present embodiment, even in performing high-speed signal transmission between the devices located on different grounds, it is possible to make the width of the ground pattern wider so that the return current path is ensured. Therefore, the characteristic impedance of the transmission line structure of lines can be designed without causing an impedance mismatch (mismatch of impedance) and good signal quality of the pattern of the high-speed signal line 26 can be ensured. Moreover, the signal quality of the pattern of the high-speed signal lines 26 can be ensured with no increase in cost, since mass-produced printed wiring boards can be generally used.

Furthermore, in Examples 1 to 4 serving as detailed examples of the above-mentioned first embodiment, when the first ground 22 can be connected by vias to one of the inner layers of the multilayer printed wiring board and the second ground 23 is connected by vias to one of the inner layers of the multilayer printed wiring board, these modified Examples 1 to 4 can be considered as Examples 5 to 8 in the second embodiment, respectively. Furthermore, one or both of the first ground 22 and the second ground 23 may be provided on the rear face opposite to the face on which the bridge is provided. Naturally, the invention encompasses such an aspect. Furthermore, the present invention also encompasses an aspect in which the high-speed signal line 26 is provided on the face opposite to the face on which the bridge 27 is provided or in an inner layer, and the high-speed signal line 26 is located directly below the bridge 27 provided on the surface. This example was described in Example 4.

The printed wiring board of the present invention allows one to select a noise absorber from various noise absorbers with taking into consideration, for example, noise suppression abilities and costs thereof, when conduction noise flows from a ground into another ground. Also, evaluation/verification of the noise removal effect on the printed wiring board can be performed by exchanging noise absorbers, and therefore, the target noises to be removed can be efficiently removed. Moreover, since the printed wiring board of the present invention allows one to select a noise absorber with taking into consideration the cost of the noise absorber to be used, conduction noise from a ground can be removed at the optimal cost, and therefore various users' demands may be met. Furthermore, the printed wiring board according to the present invention can cope with the change of the operating frequency of a device that operates in a digital circuit by changing the noise absorber, and does not require redesigning/remanufacturing of a printed wiring board. The printed wiring board of the present invention can remove the noise of a specified range of noise frequencies efficiently and does not degrade the signal quality.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A printed wiring board comprising:
   a bridge located in a surface layer;
   a noise absorber located on the bridge;
   a plurality of grounds directly connected or high-frequency-connected to the bridge;
   a first device using one of the plurality of grounds as a first reference potential;
   a second device using one of the plurality of grounds other than the ground for the first device as a second reference potential; and
   a high-speed signal line that connects the first device and the second device, the high-speed signal line being routed through a layer adjacent to the bridge in a layer direction of the printed wiring board to form a transmission line structure,
   wherein, when at least one of the plurality of grounds is located in an inner layer of the printed wiring board and has a different potential than a potential of the bridge, the inner layer and the bridge located in the surface layer are high-frequency-connected in series by a via and a capacitor, and
   wherein, when at least one of the plurality of grounds is located in the surface layer of the print wiring board and has a different potential than the potential of the bridge, the at least one of the plurality of grounds and the bridge located in the surface layer are high-frequency-connected in series by the capacitor.

2. The printed wiring board according to claim 1, wherein the noise absorber is provided detachably on the bridge.

3. The printed wiring board according to claim 2, wherein the noise absorber is provided detachably on the bridge using an adhesive agent.

4. The printed wiring board according to claim 1, wherein the noise absorber is fixed onto the bridge.

5. The printed wiring board according to claim 1, wherein the plurality of grounds and the bridge have different potentials.

6. The printed wiring board according to claim 1, wherein the noise absorber is provided to be in close contact with the bridge with no gap to reduce conduction noise from the plurality of grounds.

7. The printed wiring board according to claim 1, wherein the noise absorber is a magnetic absorber.

8. The printed wiring board according to claim 1, wherein the high-speed signal line is routed through a layer adjacent to the bridge in the layer direction of the printed wiring board so that the high-speed signal line including the via provided in the vicinity of one end of the bridge-like conductor forms a transmission line structure together with the bridge, and
- a characteristic impedance of the transmission line structure matches a line on the board.

9. The printed wiring board according to claim 1, wherein the plurality of grounds are composed of two grounds, and
- one of the grounds is used for a digital circuit and the other ground is used for an analog circuit.

* * * * *